(12) United States Patent
Mori et al.

(10) Patent No.: US 8,125,553 B2
(45) Date of Patent: Feb. 28, 2012

(54) SOLID-STATE IMAGING DEVICE

(75) Inventors: Kazuya Mori, Tsukuba (JP); Toshiyuki Ishiuchi, Tsukuba (JP)

(73) Assignee: Texas Instruments Incorporated, Dallas, TX (US)

( * ) Notice: Subject to any disclaimer, the term of this patent is extended or adjusted under 35 U.S.C. 154(b) by 527 days.

(21) Appl. No.: 12/363,090

(22) Filed: Jan. 30, 2009

(65) Prior Publication Data

US 2009/0201405 A1 Aug. 13, 2009

(30) Foreign Application Priority Data

Feb. 4, 2008 (JP) ................................. 2008-024178

(51) Int. Cl.
 *H04N 5/335* (2006.01)
(52) U.S. Cl. ........................ 348/308; 348/294
(58) Field of Classification Search .......... 348/294–324; 257/290–292
See application file for complete search history.

(56) References Cited

U.S. PATENT DOCUMENTS

| 6,160,281 | A | 12/2000 | Guidash |
| 7,238,926 | B2 | 7/2007 | Guidash et al. |
| 7,382,010 | B2 | 6/2008 | Choi |
| 7,391,066 | B2 | 6/2008 | Rhodes |
| 2008/0018765 | A1 * | 1/2008 | Choi et al. ................... 348/308 |
| 2008/0210993 | A1 * | 9/2008 | Oshikubo et al. ............. 257/292 |
| 2008/0284876 | A1 | 11/2008 | Makino |
| 2008/0308852 | A1 | 12/2008 | Lee et al. |

FOREIGN PATENT DOCUMENTS

| EP | 0 898 312 | 2/1999 |
| JP | 2007 184368 | 7/2007 |

OTHER PUBLICATIONS

"A ¼ In. 2M Pixel CMOS Image Sensor With 1.75 Transistor/Pixel," ISSCC 2004, vol. 6, No. 2, pp. 1-8 (Mitsuyoshi Mori, Motonari Katsuno, Shigetaka Kasuga, Takahiko Murata and Takumi Yamaguchi), Feb. 16, 2004.
"Highlight Scene FPN on Shared Pixels and a Reduction Technique," 2007 International Image Sensor Workshop, Maine, USA, Jun. 7-10, pp. 39-42 (Takashi Watanabe, Katsuji Kimura, Masamitsu Taki, Kohji Horikawa, Mitsuru Homma, Shoko Daikoku, Tetsuya Fujimoto and Kiyotoshi Misawa).

* cited by examiner

*Primary Examiner* — Darryl J Collins
(74) *Attorney, Agent, or Firm* — John J. Patti; Wade J. Brady, III; Frederick J. Telecky, Jr.

(57) ABSTRACT

An imaging apparatus is provided. The apparatus generally comprises an array and storage elements. The array includes photosensitive cells that are arranged in a plurality of columns and a plurality of rows such that each column includes a set of photosensitive cell pairs that have a shared region with a share floating diffusion region and a shared selection transistor. Also, the location of each shared region of each column is shifted by one row in each adjacent column.

17 Claims, 9 Drawing Sheets

SOLID-STATE IMAGING DEVICE

CROSS-REFERENCE TO RELATED APPLICATIONS

This application is claims priority to Japanese Patent Application No. 2008-024178, entitled "Solid-State Image Pickup Device," filed on Feb. 4, 2008, which is hereby incorporated by reference for all purposes.

TECHNICAL FIELD

The invention relates generally to a solid-state imaging device and, more particularly, to a CMOS imaging device.

BACKGROUND

As the characteristics of CMOS (Complementary Metal-Oxide-Semiconductor) image sensors, CCD (Charge Coupling Device) image sensors, and other types of image input image sensors have improved, there has been increased demand to use these sensors in applications such as for digital cameras and camera-equipped cell phones. As a result of the development of the CMOS and CCD image sensors, there are numerous variations is the designs these image sensors. Some examples of convention designs are: Japanese Patent Appl. No. 2007-184368; European Patent No. 0898312; U.S. Pat. No. 6,160,281; U.S. Pat. No. 7,238,926; U.S. Pat. No. 7,382,010; U.S. Pat. No. 7,391,066; U.S. Patent Pre-Grant Publ. No. 2008/0284876; U.S. Patent Pre-Grant Publ. No. 2008/0308852; McGrath et al., "Shared Pixels for CMOS Image Sensor Arrays," *Proc.* 2005 *IEEE workshop on CCD and AIS*, Nagano, Japan, Jun. 9-11, 2005; Watanabe et al., "High Light Sense FPN on Shared and a Reduction Technique," 2007 *International Image Sensor Workshop*, Maine, USA, Jun. 7-10, 2007; Mori et al. "A ¼ in 2M Pixel CMOS Image Sensor with 1.75 Transistor/Pixel," *ISSCC Dig. Tech. Papers*, Vol. 6, No. 2, 2004.

SUMMARY

A preferred embodiment of the present invention, accordingly, provides an apparatus. The apparatus comprises an array having a plurality of photosensitive cells that are arranged in a plurality of columns and a plurality of rows, wherein each column includes a set of photosensitive cell pairs that have a shared region with a share floating diffusion region and a shared selection transistor, and wherein the location of each shared region of each column is shifted by one row in each adjacent column; and a plurality of storage elements, wherein each storage element is associated with at least one column.

In accordance with a preferred embodiment of the present invention, each shared region further comprises a shared amplifier, a shared reset transistor, and a shared transfer transistor.

In accordance with a preferred embodiment of the present invention, the apparatus further comprises a row selection logic that is coupled to each shared selection transistor.

In accordance with a preferred embodiment of the present invention, the row selection logic further comprises a plurality shift registers that are arranged in a sequence, wherein each shift register is associated with at least one row, and wherein each shift register in the sequence is coupled to each adjacent shift register in the sequence; and a plurality combinational logic element, wherein each combinational logic element is coupled to a set of shared selection transistors and coupled to at least one shift register.

In accordance with a preferred embodiment of the present invention, each combination logic element further comprises an OR gate that is coupled to two adjacent shift registers; and an AND gate that is coupled between the set of shared selection transistors and the OR gate.

In accordance with a preferred embodiment of the present invention, each column further comprises at least one photosensitive cell having an unshared floating diffusion region.

In accordance with a preferred embodiment of the present invention, each photosensitive cell further comprises a photodiode.

In accordance with a preferred embodiment of the present invention, each storage element further comprises a storage capacitor.

In accordance with a preferred embodiment of the present invention, an apparatus is provided. The apparatus comprises a plurality of photosensitive cell pairs, wherein each pair includes a shared region with a shared floating diffusion region and a shared selection transistor; a plurality of columns of a first type having a first set of photosensitive cell pairs that are adjacent to one another, wherein each first set begins at the first row position; and a plurality of columns of a second type having a second set of photosensitive cell pairs that are adjacent to one another, wherein each second set begins at the second row position, and wherein the columns of the first type and the columns of the second type are adjacent to one another in an alternating pattern.

In accordance with a preferred embodiment of the present invention, the apparatus further comprises a plurality storage elements, wherein each storage element is associated with at least one of the columns.

In accordance with a preferred embodiment of the present invention, each column of the second type further comprises at least one photosensitive cell having an unshared floating diffusion region at its first row position.

In accordance with a preferred embodiment of the present invention, each column of the first type further comprises at least one photosensitive cell having an unshared floating diffusion region at its last row position.

In accordance with a preferred embodiment of the present invention, each photosensitive cell further comprises a photodiode.

In accordance with a preferred embodiment of the present invention, an apparatus is provided. The apparatus comprises an array having a plurality of photosensitive cell pairs, wherein each pair includes a shared region with a shared floating diffusion region and a shared selection transistor; a plurality of columns of a first type having a first set of photosensitive cell pairs that are adjacent to one another, wherein each first set begins at the first row position; and a plurality of columns of a second type having a second set of photosensitive cell pairs that are adjacent to one another, wherein each second set begins at the second row position, and wherein the columns of the first type and the columns of the second type are adjacent to one another in an alternating pattern; a plurality of storage elements, wherein each storage element is associated with at least one column; a plurality shift registers that are arranged in a sequence, wherein each shift register is associated with at least one row, and wherein each shift register in the sequence is coupled to each adjacent shift register in the sequence; a plurality of OR gates, wherein each OR gate is coupled to two adjacent shift registers; and a plurality of AND gates, wherein each AND gate is coupled between a set of shared selection transistors and at least one of the OR gates.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
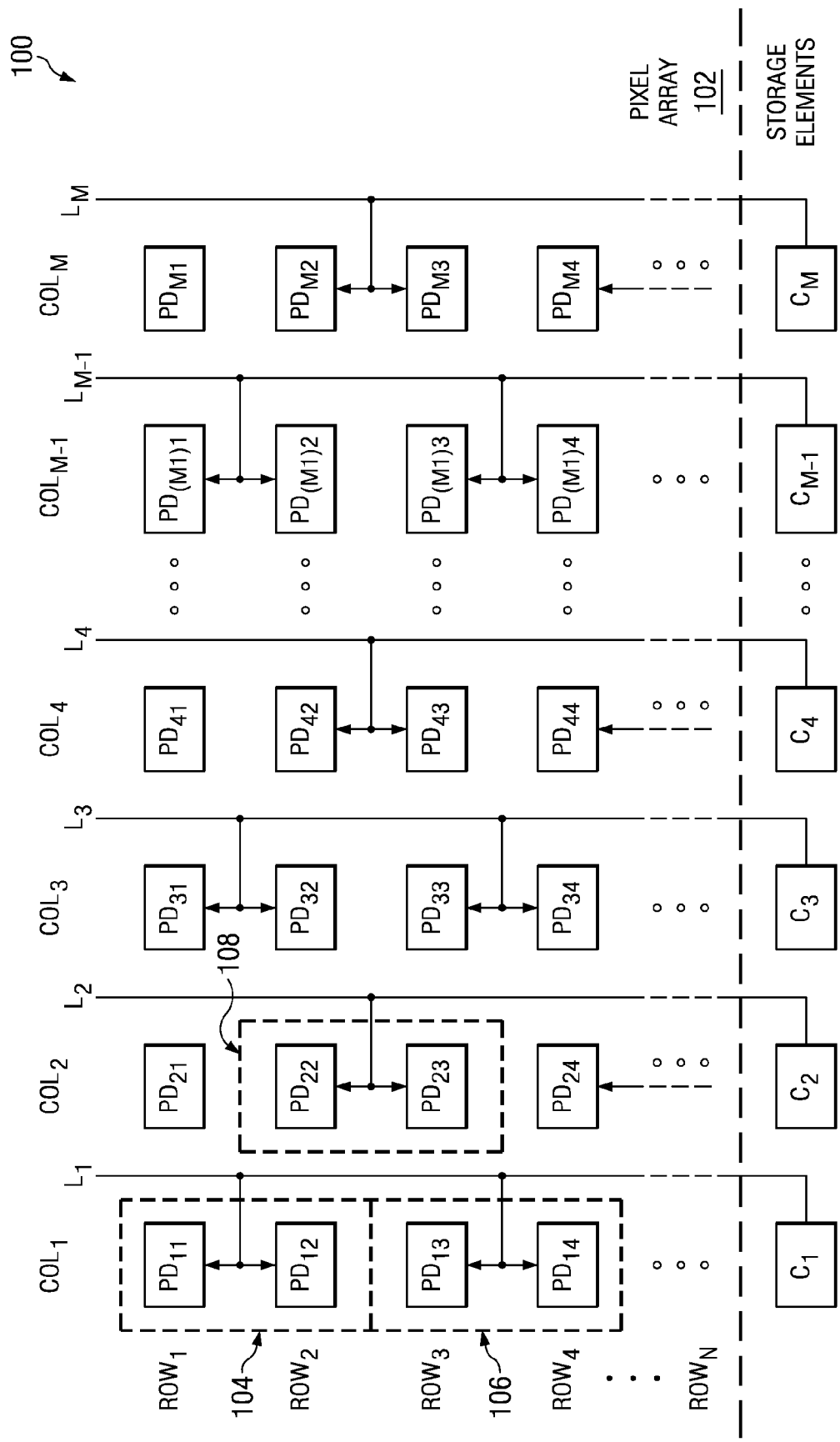
FIG. 1 is a block diagram depicting an imagine sensor in accordance with a preferred embodiment of the present invention.

Refer now to the drawings wherein depicted elements are, for the sake of clarity, not necessarily shown to scale and wherein like or similar elements are designated by the same reference numeral through the several views.

Referring to FIG. 1A of the drawings, the reference numeral 100 generally designates an image sensor in accordance with a preferred embodiment of the present invention. Image sensor 100 generally comprises a pixel array 102 and storage elements $C_1$ to $C_M$. Image sensor 100 can also include other elements, which are not depicted.

For the array 102, it includes a number of pixels that are arranged in a matrix having M columns $COL_1$ to $COL_M$ and N rows $ROW_1$ to $ROW_N$. Each pixel includes a photosensitive cell (preferably including photodiodes as shown) $PD_{11}$ to $PD_{MN}$ that is adapted to receive light and convert it to an electrical signal. These photosensitive cells $PD_{11}$ to $PD_{MN}$ are arranged to have shared or unshared elements within each of the columns $COL_1$ to $COL_M$. Preferably, two photosensitive cells can share elements in a shared arrangement, such as the photosensitive cell pairs 104, 106, and 108, and include a shared region between them (shown by the arrows).

Preferably, there are two types of columns that can be differentiated by their arrangements of photosensitive cell pairs. The first column $COL_1$ is an example of a column of a first type, which includes a set of photosensitive cell pairs (shown here as pairs 104 and 106) that are adjacent to one another where the set begins at the first row position. The second column $COL_2$ is an example of a column of the second type which includes a set of photosensitive cell pairs (shown here as pair 108) that are adjacent to one another where the set begins at the second row position. Additionally, an unshared photosensitive cell $PD_{21}$ can be included in the first position of the second column $COL_2$ (column of the second type), and an unshared photosensitive cell can be included in the last row position of the column of the first type.

These two column types can then be arranged to form the pixel array 102. As can be seen columns of the first type and of the second type are arranged to be adjacent one another in an alternating pattern. In other words, the location of each shared region of each column is shifted by one row in each adjacent column. Consequently, it is possible to reduce the size of the pixels and to generally ensure parallel symmetry.

To operate, each column $COL_1$ to $COL_M$ is coupled to one of the storage elements $C_1$ to $C_M$. Each of the photosensitive cells $PD_{11}$ to $PD_{MN}$ is coupled to a line $L_1$ to $L_M$ that corresponds to its column. Data or signal potentials from each photosensitive cell $PD_{11}$ to $PD_{M4}$ can be carried to the storage element $C_1$ to $C_M$ that corresponds to its column. These storage elements $C_1$ to $C_M$ are generally comprised of sample-and-hold capacitors.

Figure 2:
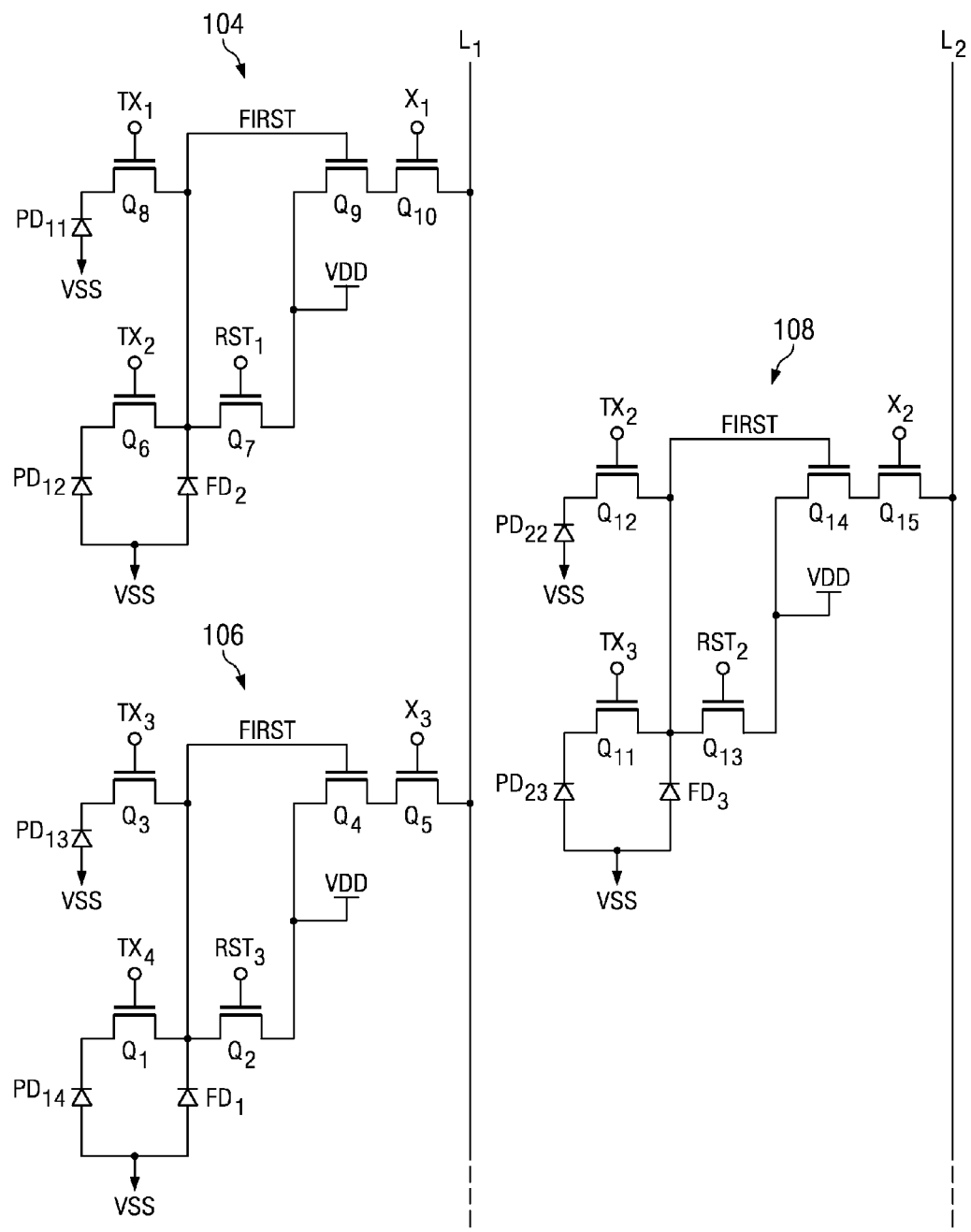
FIG. 2 is a circuit diagram depicting at least some the pixels of the image sensor of FIG. 1.

Now turning to FIG. 2 of the drawings, the pairs 104, 106, and 108 can be seen in greater detail. As shown, the photosensitive cells $PD_{11}$, $PD_{12}$, $PD_{13}$, $PD_{14}$, $PD_{22}$, and $PD_{23}$ are comprised of photodiodes with their anodes being coupled to rail VSS. With each pair 104, 106, and 108, a transfer transistor Q1, Q3, Q4, Q8, Q11, and Q12 is coupled between the cathode of its respective photodiode $PD_{11}$, $PD_{12}$, $PD_{13}$, $PD_{14}$, $PD_{22}$, and $PD_{23}$ and its respective shared region. The shared region for each pair 104, 106, and 108 is generally comprised of floating diffusion region $FD_2$, $FD_1$, and $FD_3$ (respectively), a reset transistor $Q_7$, $Q_2$, and $Q_{13}$ (respectively), an amplifier $Q_9$, $Q_4$, and $Q_{14}$ (respectively), and a transfer transistor $Q_{10}$, $Q_5$, and $Q_{15}$ (respectively). This arrangement, thus, allows for there to be 2.5 transistors per pixel, thus, reducing the area occupied by a pixel.

Looking to pair 104 as an example, the operation of the shared arrangement can be seen from FIG. 2. When the photodiodes $PD_{12}$ and $PD_{11}$ are exposed to light for a predetermined period of time, a photoelectric charge can be generated and stored. When data is read from the pixel corresponding to photodiode $PD_{12}$, the transfer transistor Q6 is actuated to transfer the charge from the photodiode $PD_{12}$ to the floating diffusion region $FD_2$. The charge at the floating diffusion region $FD_2$ is amplified by amplifier $Q_9$ and output to through transfer transistors $Q_{10}$ to line $L_1$ so that it can be stored in storage element $C_1$. Once stored on storage element $C_1$, the reset transistor $Q_7$ is actuated to "reset" the floating diffusion region $FD_2$. Additionally, the floating diffusion region can be "reset" prior to receiving a charge from the photodiodes $PD_{12}$ and $PD_{11}$.

For image sensor 100, sharing structural elements between adjacent pixels as well as by sharing layout space and VDD nodes, it is possible to reduce the number of circuit structural elements and to increase the photodiode surface area. As a result, it is possible to increase the light collection efficiency and the charge that can be stored, to reduce the size of the pixels, and to increase sensitivity, dynamic range, and resolution. For example, when the cells of 3 μm square are designed according to the 0.35-μm rule, it is possible to share the floating diffusion area and the VDD terminal, it is possible to increase the photodiode surface area by 20%, and to increase the dynamic range and sensitivity by 20%. Or, if the dynamic range and sensitivity are maintained, it is possible to reduce the area occupied by the pixel by 20% and to increase the resolution by 20%.

Also, it is possible to reduce the wiring area for each pixel and to obtain a sufficient aperture size. Thus, it is possible to improve sensitivity. Also, because a read line is set for each pixel, it is possible to maintain the parallel symmetry of the pixels and to improve the horizontal resolution. In addition, it is possible to complete one read cycle during the row read period to increase the frame reading speed by 20% and to improve the moving picture reproduction performance. It is also possible to maintain synchronized reading speeds for each horizontal line and to reduce the horizontal line fixed pattern noise that is generated by sharing floating diffusion. In addition, it is possible to simplify the driving timing and to make the dynamic generator circuit more compact.

Figure 3:
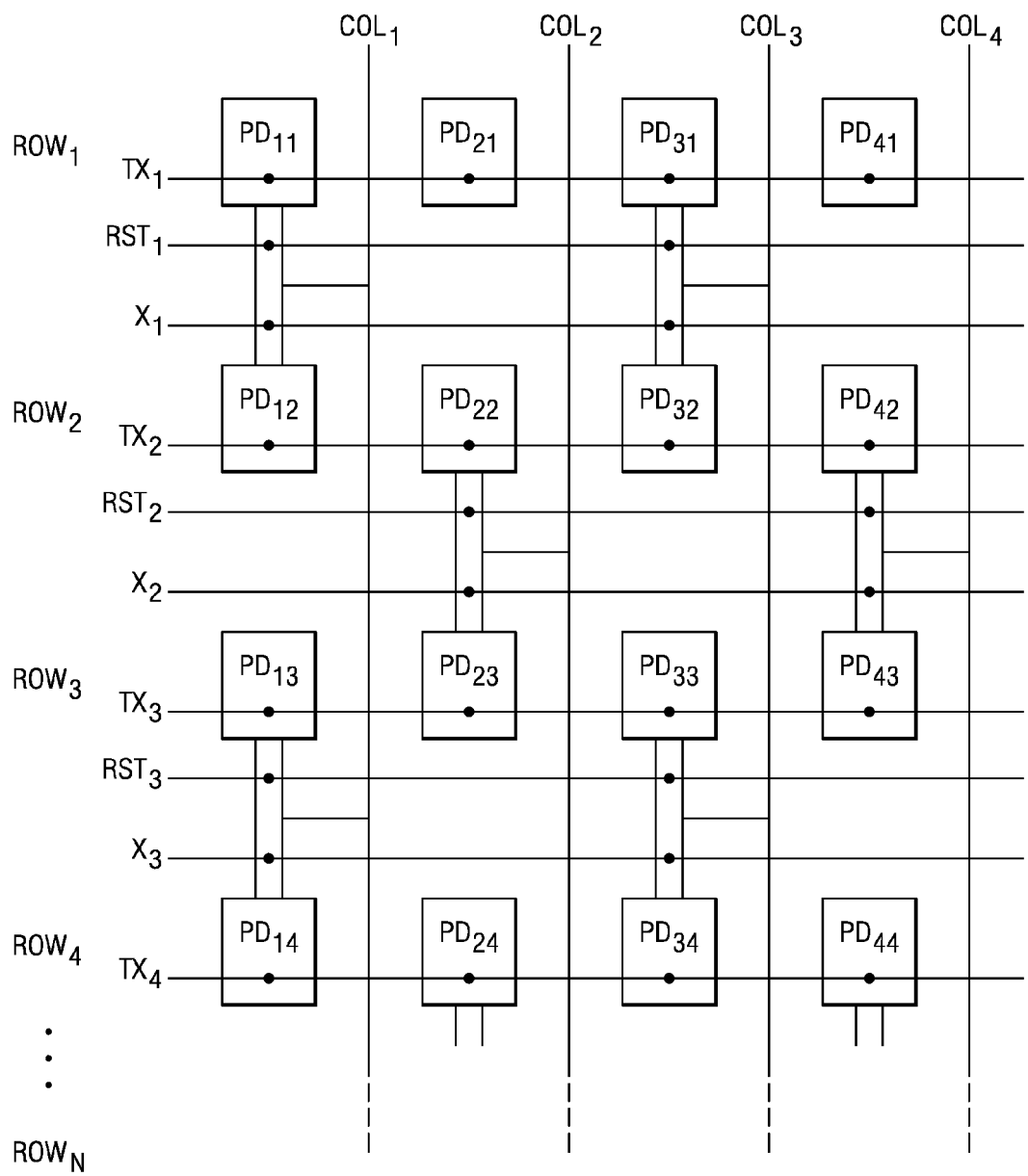
FIG. 3 is a block diagram depicting a connection scheme for the pixel array of FIG. 1.

Turning to FIG. 3 of the drawings, a connection or wiring scheme for the image sensor 100 can be seen. Preferably, lines $RST_1$ through $RST_N$ are connected to the gate electrodes of the reset transistors within each row $ROW_1$ to $ROW_N$, respectively, and within every other column (as shown) at the locations of the shared regions. Lines $X_1$ through $X_N$ are connected to the gate electrodes of the selection transistors within each row $ROW_1$ to $ROW_N$, respectively, and within every other column (as shown) at the locations of the shared regions.

Figure 4:
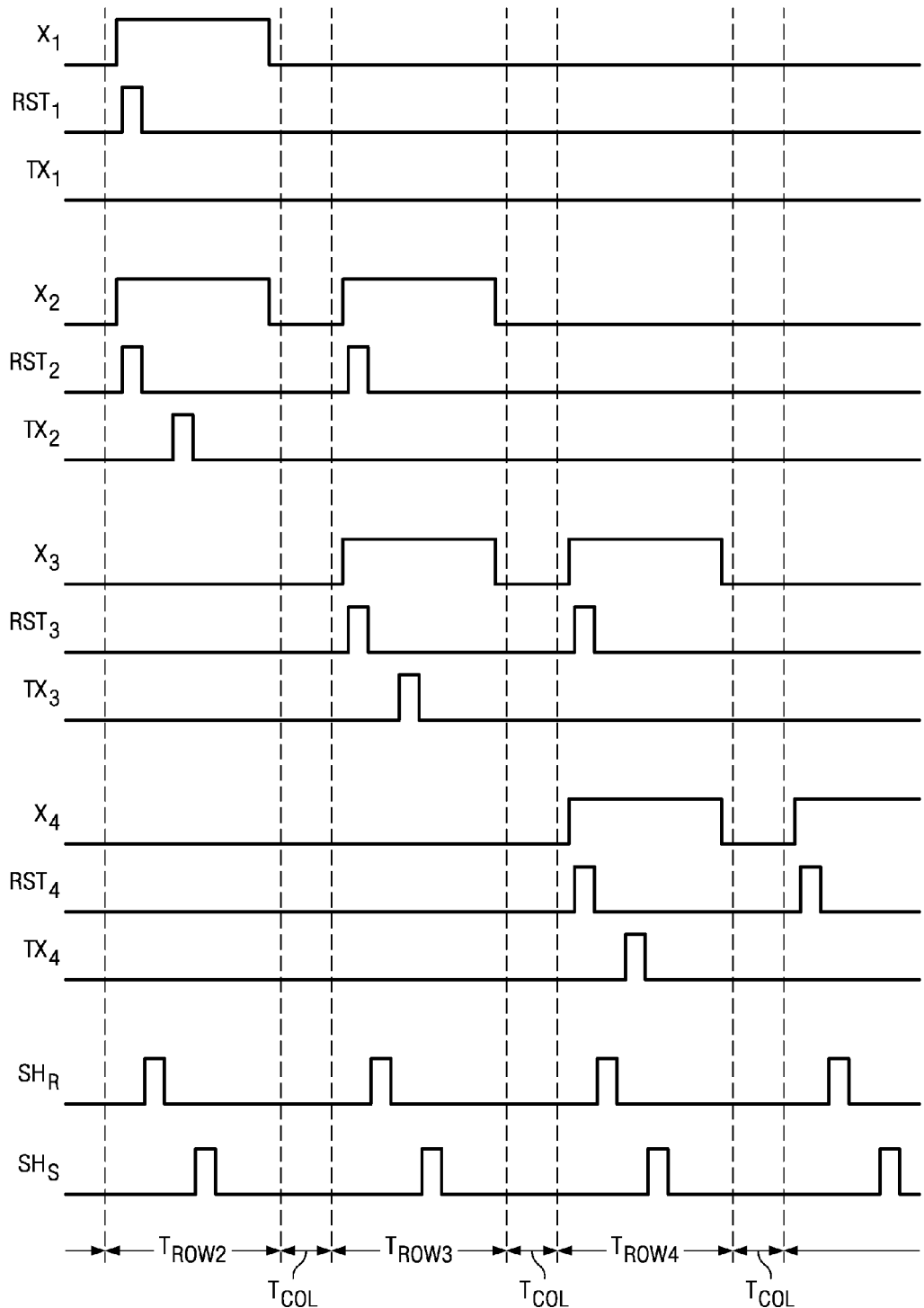
FIG. 4 is a timing diagram for the image sensor of FIG. 1.

Turning to FIG. 4, an example timing diagram for the image sensor 100 is shown. Generally, the timing diagram depicts operations for the second row $ROW_2$, the third row $ROW_3$, and the fourth row $ROW_4$, but the operations depicted can be extrapolated for the remainder of the rows. Additionally, FIG. 4 generally illustrates the voltages applied to lines $RST_1$ to $RST_2$, lines $X_1$ to $X_4$, and lines $TX_1$ to $TX_4$ (which are connected to the gate electrodes of the transfer transistors of the corresponding rows).

As shown, for the first time period $T_{ROW2}$, signal potentials from the second row $ROW_2$ are read out. To accomplish this, lines $X_1$ and $X_2$ are driven to logic high, which actuates the transfer transistors for the first row $ROW_1$ and the second row $ROW_2$. Lines $RST_1$ and $RST_2$ are then driven to logic high to reset the floating diffusion regions for the first row $ROW_1$ and the second row $ROW_2$. Once the floating diffusion regions are reset, lines $RST_1$ and $RST_2$ driven to logic low, and the reset line $SH_R$ for the storage elements $C_1$ to $C_M$ is driven to logic high to reset the storage elements $C_1$ to $C_M$. Once the storage elements $C_1$ to $C_M$ have been reset, the line SHR is driven to logic low, and line $TX_2$ is driven to logic high to transfer the signal potential from the photodiodes of the second row ROW2 to their respective floating diffusion regions. After the transfer of the signal potential, the line $TX_2$ is driven to logic low, and the line $SH_S$ is driven to logic high so that the storage elements $C_1$ to $C_M$ can store the respective signal potentials. Once stored, the line $SH_S$ is drive to logic low, and lines $X_1$ and $X_2$ are driven to logic low. During the following column read period $T_{COL}$, the signal potentials are read out of the storage elements $C_1$ to $C_M$. Following the column readout period $T_{COL}$ the process can be repeated for the remaining rows.

Figure 5:
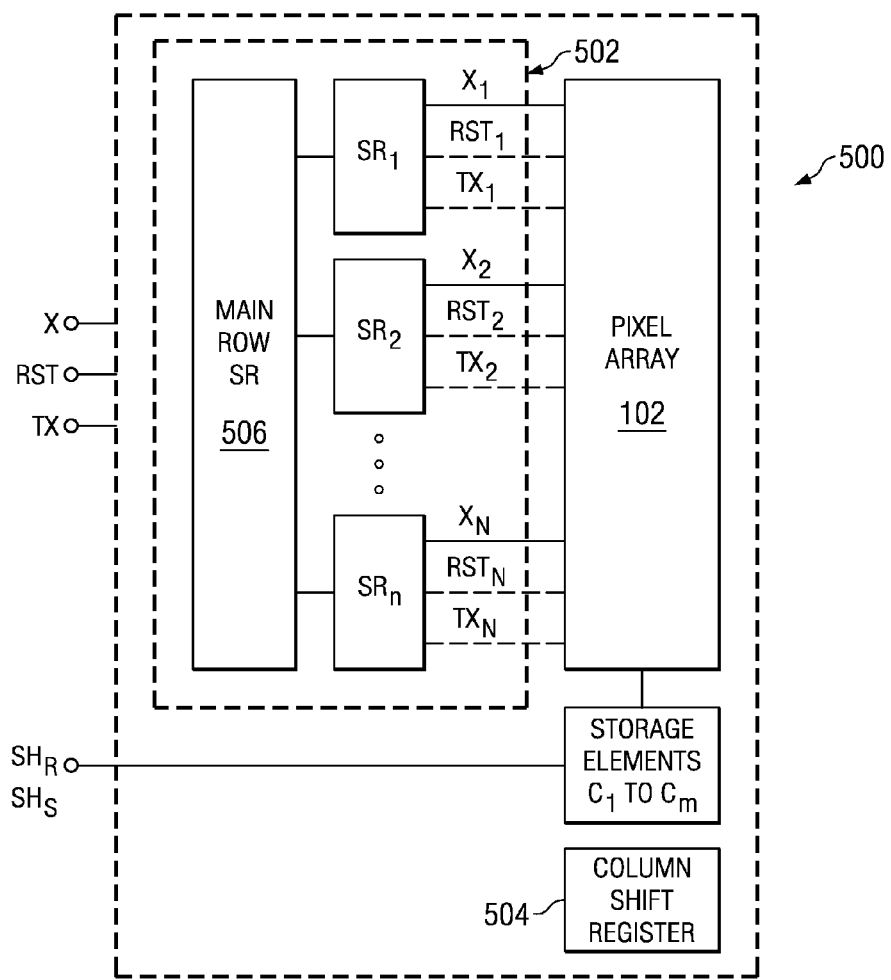
FIG. 5 is a circuit block diagram illustrating the an image sensor in accordance with a preferred embodiment of the present invention.

Turning to FIG. 5, an integrated circuit (IC) 500 that includes the image sensor of FIG. 1. is shown. Sensor 500 generally comprises pixel array 102, row selection logic 502, storage elements $C_1$ to $C_M$, and column shift register 504.

For the image sensor 500, the row selection logic 502 is located along the periphery of the pixel array 102, and it generally drives lines $RST_1$ to $RST_N$, lines $X_1$ to $X_N$, and lines $TX_1$ to $TX_N$. Row selection logic 502 is generally comprised of main row shift register 506, and row shift registers $SR_1$ to $SR_N$. Preferably, each row shift register $SR_1$ to $SR_N$ is associated with one row of the pixel array 102, and the main row shift register 506 generally provides control signals to the row shift registers $SR_1$ to $SR_N$. Additionally, row selection logic 502 is coupled to lines X RST, and TX.

Located adjacent to storage elements $C_1$ to $C_M$ is the column shift register 504. The column shift register 504 to operates to perform column readouts from storage elements $C_1$ to $C_M$ during a predetermined cycle.

Figure 6:
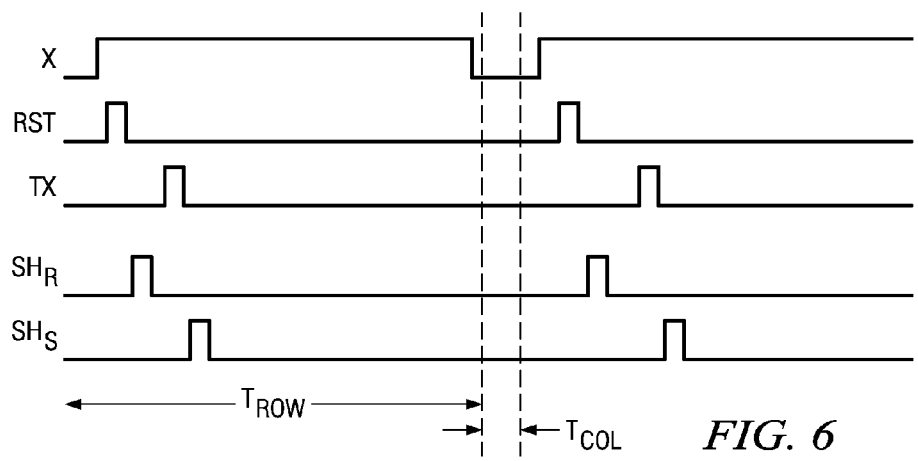
FIG. 6 is a timing diagram illustrating the clock signals for the image sensor of FIG. 5

Now turning to FIG. 6, an example of a timing diagram for lines X, RST, and TX of FIG. 5. Generally, line X is associated with a "selection" of image sensor 500, while line RST is associated with a "reset" for image sensor 500 and line TX is associated with a "transfer" for image sensor 500. Preferably, lines X, RST, and TX allow the row selection logic 502 to perform selections, resets, and transfers for each row.

Figure 7:
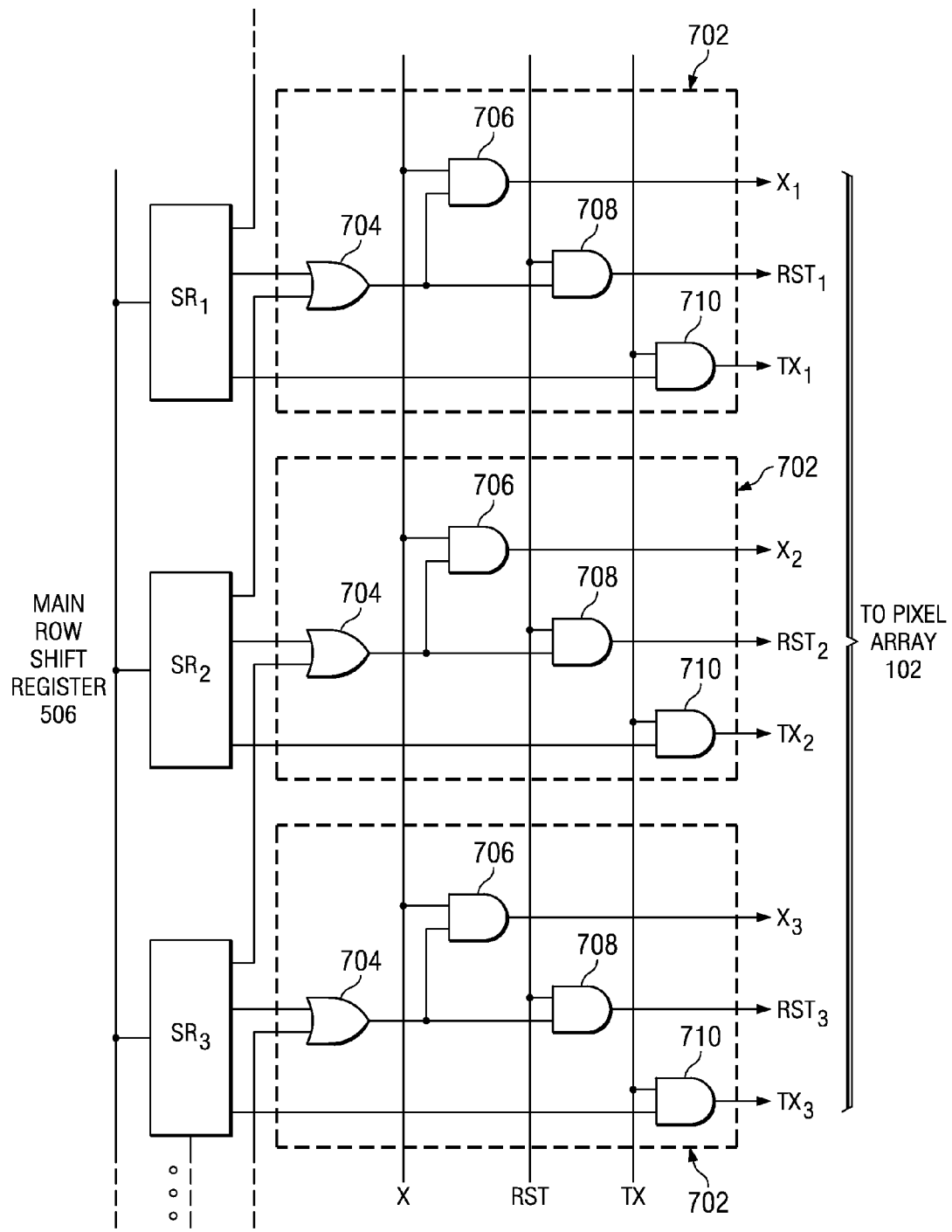
FIG. 7 is a block diagram of the row selection logic of FIG. 5 in accordance with a preferred embodiment of the present invention.

In FIG. 7, an example of row selection logic 502 is shown in greater detail. As can be seen, a combination logic element 702 is located between each shift register $SR_1$ to $SR_N$ and the pixel array 102 and is coupled to lines X, RST, and TX. Also, the shift registers $SR_1$ to $SR_N$ are coupled to one another, so that readouts for the rows of the pixel array 102 can be performed in sequence.

Preferably, each combination logic element 702 is comprise of an OR gate 704 and AND gates 706, 708, and 710. When a particular row is selected for a readout (for example the first row), the shift register SR1 (for example) would output a logic high signal to OR gate 704, which would subsequently output a logic high signal to AND gates 706, 708, and 710. When line X is driven to logic high as shown in FIG. 6, AND gate 706 would output a logic high signal, selecting its row. When line RST is driven to logic high, AND gate 708 would output a logic high signal, resetting the floating diffusion regions for its row, and when line TX is driven to logic high, AND gate 710 would output a logic high signal, transferring signal potentials from its row to the storage elements $C_1$ to $C_M$. Thus, the use of OR gate 704 in combination with the AND gates 706, 708, and 710 generally obviates the need for a timing generator or other redundant circuits.

Figure 8:
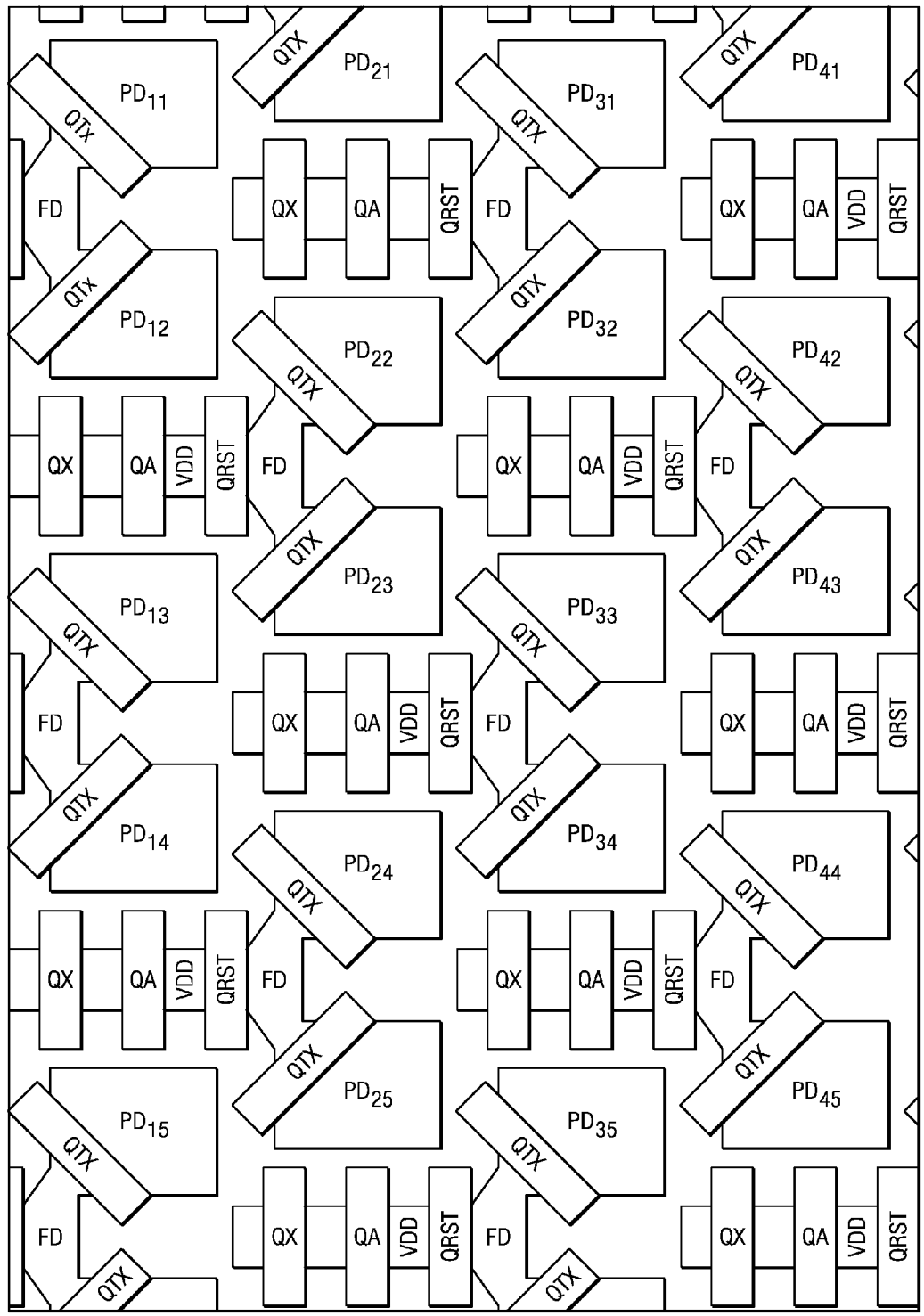
FIG. 8 is an example layout diagram for the pixel array of FIG. 1.

In FIG. 8, an example of a layout diagram illustrating the pixel array 102 is shown. Here, for each pixel, photosensitive cells (preferably photodiodes) $PD_{11}$ to $PD_{MN}$, transfer transistors QTX, reset transistor QRST, amplification transistor QA, selection transistor QX, and floating diffusion region FD are laid out.

Figures 9A, 9B:
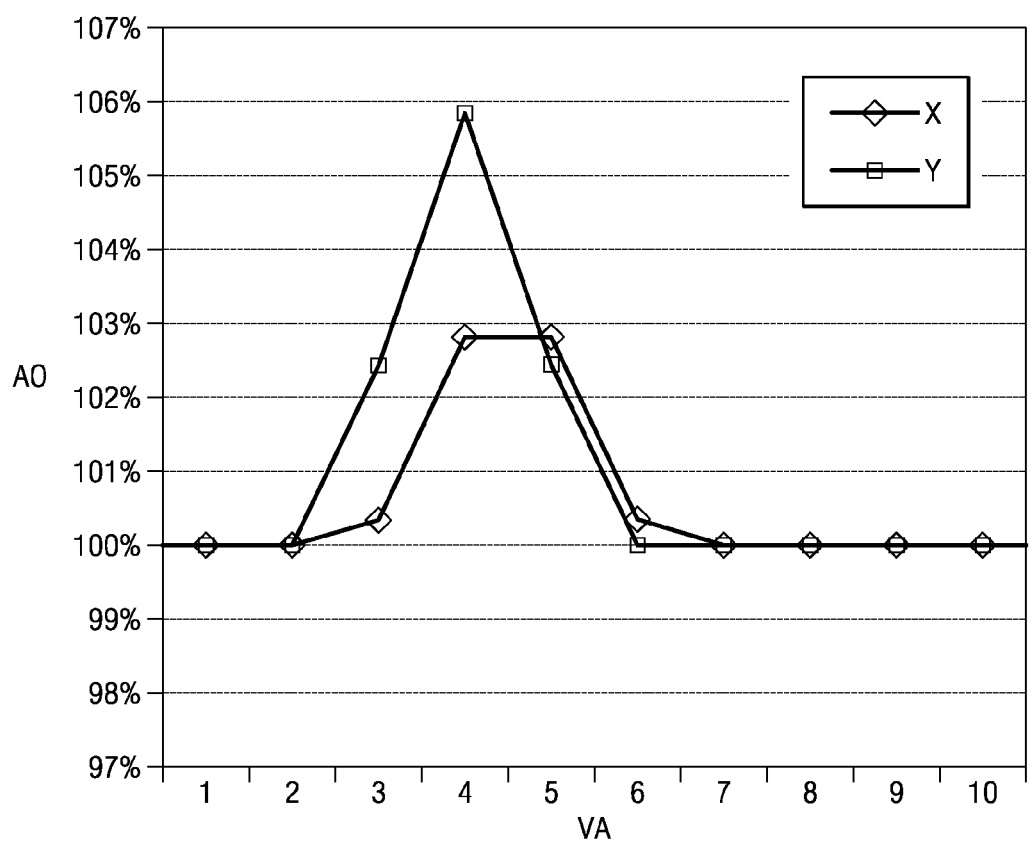
FIG. 9A is an example layout diagram for the pixel array for the image sensor of FIG. 1 that employs color filters.
FIG. 9B is a graph depicting the average output versus vertical address of the filter image sensor of FIG. 9A.

In FIG. 9A, an example layout diagram illustrating a color filter arranged on pixel array 102 is shown. Here, R, G, and B represent red, green, and blue color filters, and the numerals indicate the pixel positions. For example, R11 indicates that a red filter is set in the pixel containing photosensitive cell $PD_{11}$, whereby the so-called Bayer configuration is realized.

In said FIG. 9B, the average output AO with respect to vertical address VA of the RGB output after the process when lateral lines are generated with one horizontal output 10% greater than the output above and below it is shown. In the figure, X represents image sensor 100 and/or 500, and Y represents a conventional sensor. If G32 is G, and R33 is R, the following process is performed.

$$G32:G=G32, R=(R31+R33)/2, B=(B22+B42)/2 \quad (1)$$

$$R32:G=(G23+G32+G34+G43)/4, R=R33, B=(B22+B24+B42+B44)/4 \quad (2)$$

As shown in FIG. 9B, image sensor 100 and/or 500, the peak of average output AO is halved compared with the conventional sensor, and the fixed pattern noise of the lateral line is also halved.

Figure 10:
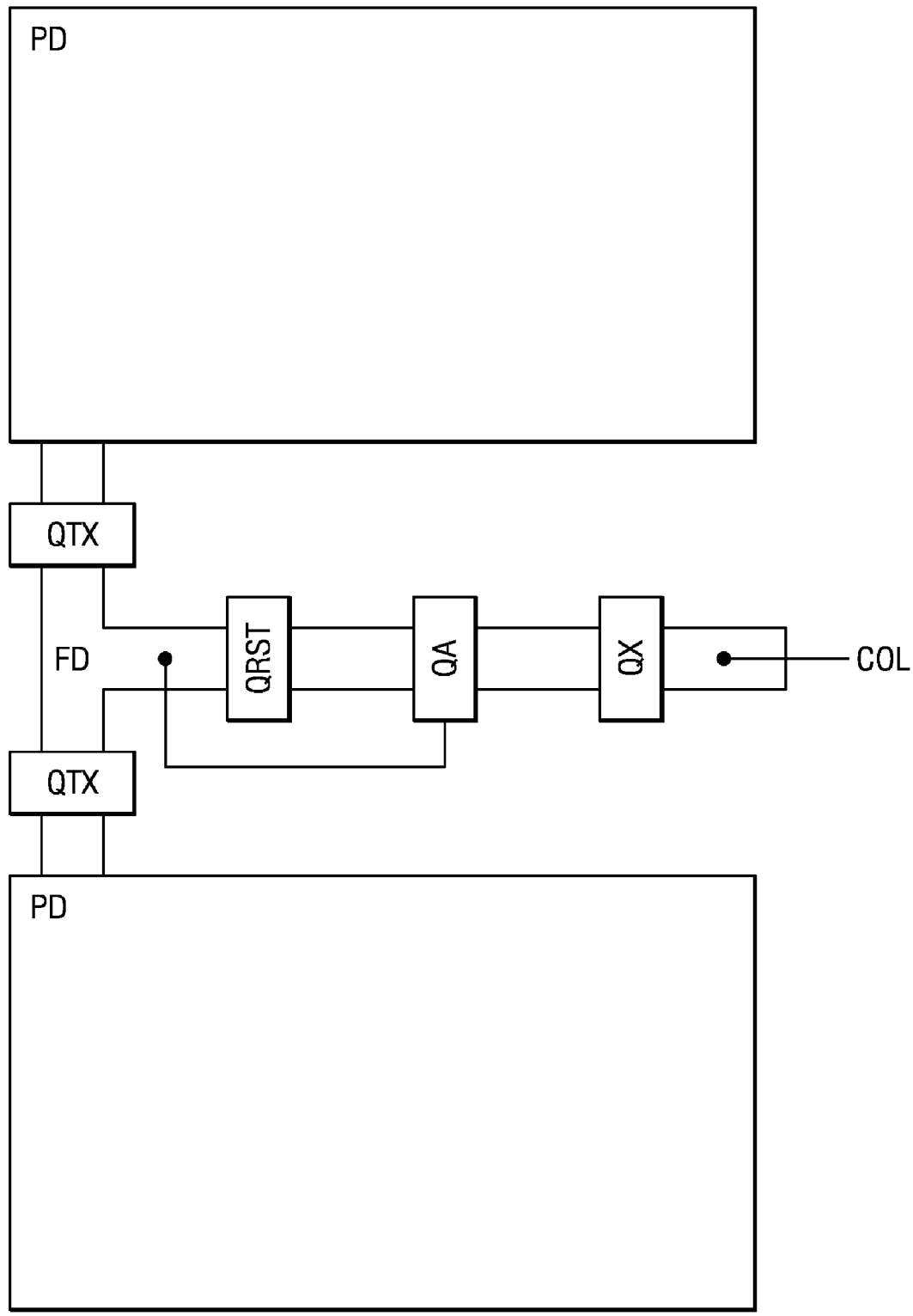
FIG. 10 is an example layout diagram for a photosensitive cell pair.

FIG. 10 is an example layout diagram for the photosensitive cell pair. In the region sandwiched between the photosensitive cells PD, the following parts are laid out: transfer transistors QTX, reset transistor QRST, amplification transistor QA, and selection transistor QX, and floating diffusion region FD.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising;
 an array having a plurality of photosensitive cells that are arranged in a plurality of columns and a plurality of rows, wherein each column includes a set of photosensitive cell pairs that have a shared region with a share floating diffusion region and a shared selection transistor, and wherein the location of each shared region of each column is shifted by one row in each adjacent column;
 a plurality of storage elements, wherein each storage element is associated with at least one column; and
 row selection logic that is coupled to each shared selection transistor, wherein the row selection logic includes:
  a plurality shift registers that are arranged in a sequence, wherein each shift register is associated with at least one row, and wherein each shift register in the sequence is coupled to each adjacent shift register in the sequence; and
  a plurality combinational logic element, wherein each combinational logic element is coupled to a set of shared selection transistors and coupled to at least one shift register.

2. The apparatus of claim 1, wherein each shared region further comprises a shared amplifier, a shared reset transistor, and a shared transfer transistor.

3. The apparatus of claim 1, wherein each combination logic element further comprises:
 an OR gate that is coupled to two adjacent shift registers; and
 an AND gate that is coupled between the set of shared selection transistors and the OR gate.

4. The apparatus of claim 1, wherein each column further comprises at least one photosensitive cell having an unshared floating diffusion region.

5. The apparatus of claim 1, wherein each photosensitive cell further comprises a photodiode.

6. The apparatus of claim 1, wherein each storage element further comprises a storage capacitor.

7. An apparatus comprising:
 a plurality of photosensitive cell pairs, wherein each pair includes a shared region with a shared floating diffusion region and a shared selection transistor;
 a plurality of columns of a first type having a first set of photosensitive cell pairs that are adjacent to one another, wherein each first set begins at the first row position;
 a plurality of columns of a second type having a second set of photosensitive cell pairs that are adjacent to one another, wherein each second set begins at the second row position, and wherein the columns of the first type and the columns of the second type are adjacent to one another in an alternating pattern; and
 row selection logic that is coupled to each shared selection transistor.

8. The apparatus of claim 7, wherein each shared region further comprises a shared amplifier, a shared reset transistor, and a shared transfer transistor.

9. The apparatus of claim 7, wherein the row selection logic further comprises:
 a plurality shift registers that are arranged in a sequence, wherein each shift register is associated with at least one row, and wherein each shift register in the sequence is coupled to each adjacent shift register in the sequence; and
 a plurality combinational logic element, wherein each combinational logic element is coupled to a set of shared selection transistors and coupled to at least one shift register.

10. The apparatus of claim 9, wherein each combination logic element further comprises:
 an OR gate that is coupled to two adjacent shift registers; and
 an AND gate that is coupled between a set of shared selection transistors and the OR gate.

11. The apparatus of claim 7, wherein each column of the second type further comprises at least one photosensitive cell having an unshared floating diffusion region at its first row position.

12. The apparatus of claim 7, wherein each column of the first type further comprises at least one photosensitive cell having an unshared floating diffusion region at its last row position.

13. The apparatus of claim 7, wherein each photosensitive cell further comprises a photodiode.

14. An apparatus comprising:
 a plurality of photosensitive cell pairs, wherein each pair includes a shared region with a shared floating diffusion region and a shared selection transistor;
 a plurality of columns of a first type having a first set of photosensitive cell pairs that are adjacent to one another, wherein each first set begins at the first row position;
 a plurality of columns of a second type having a second set of photosensitive cell pairs that are adjacent to one another, wherein each second set begins at the second row position, and wherein the columns of the first type and the columns of the second type are adjacent to one another in an alternating pattern; and
 a plurality storage elements, wherein each storage element is associated with at least one of the columns.

15. The apparatus of claim 14, wherein each storage element further comprises a storage capacitor.

16. An apparatus comprising:
 an array having:
  a plurality of photosensitive cell pairs, wherein each pair includes a shared region with a shared floating diffusion region and a shared selection transistor;
  a plurality of columns of a first type having a first set of photosensitive cell pairs that are adjacent to one another, wherein each first set begins at the first row position; and
  a plurality of columns of a second type having a second set of photosensitive cell pairs that are adjacent to one another, wherein each second set begins at the second row position, and wherein the columns of the first type and the columns of the second type are adjacent to one another in an alternating pattern;

a plurality of storage elements, wherein each storage element is associated with at least one column;

a plurality shift registers that are arranged in a sequence, wherein each shift register is associated with at least one row, and wherein each shift register in the sequence is coupled to each adjacent shift register in the sequence;

a plurality of OR gates, wherein each OR gate is coupled to two adjacent shift registers; and a plurality of AND gates, wherein each AND gate is coupled between a set of shared selection transistors and at least one of the OR gates.

17. The apparatus of claim 16, wherein each column of the second type further comprises at least one photosensitive cell having an unshared floating diffusion region at its first row position.

* * * * *